(12) United States Patent
Wang (10) Patent No.: US 8,692,362 B2
(45) Date of Patent: Apr. 8, 2014

(54) SEMICONDUCTOR STRUCTURE HAVING CONDUCTIVE VIAS AND METHOD FOR MANUFACTURING THE SAME

(75) Inventor: Meng-Jen Wang, Pingtung (TW)

(73) Assignee: Advanced Semiconductor Engineering, Inc. (TW)

( * ) Notice: Subject to any disclaimer, the term of this patent is extended or adjusted under 35 U.S.C. 154(b) by 186 days.

(21) Appl. No.: 13/103,059

(22) Filed: May 7, 2011

(65) Prior Publication Data

US 2012/0049347 A1    Mar. 1, 2012

(30) Foreign Application Priority Data

Aug. 30, 2010    (TW) .............................. 099129126 A (51) Int. Cl.
H01L 23/02    (2006.01)
(52) U.S. Cl.
USPC ........... 257/678; 257/686; 257/690; 257/691; 257/706
(58) Field of Classification Search
USPC .......................... 257/678, 686, 690, 691, 706
See application file for complete search history.

(56) References Cited

U.S. PATENT DOCUMENTS

| | | | |
|---|---|---|---|
| 3,761,782 A | 9/1973 | Youmans | |
| 4,394,712 A | 7/1983 | Anthony | |
| 4,499,655 A | 2/1985 | Anthony | |
| 4,807,021 A | 2/1989 | Okumura | |
| 4,842,699 A | 6/1989 | Hua et al. | |
| 4,897,708 A | 1/1990 | Clements | |
| 4,982,265 A | 1/1991 | Watanabe et al. | |
| 5,166,097 A | 11/1992 | Tanielian | |
| 5,191,405 A | 3/1993 | Tomita et al. | |
| 5,229,647 A | 7/1993 | Gnadinger | |
| 5,239,448 A | 8/1993 | Perkins et al. | |
| 5,308,443 A | 5/1994 | Sugihara | |
| 5,404,044 A | 4/1995 | Booth et al. | |
| 5,615,477 A | 4/1997 | Sweitzer | |
| 5,643,831 A | 7/1997 | Ochiai et al. | |
| 5,998,292 A | 12/1999 | Black et al. | |
| 6,175,497 B1 * | 1/2001 | Tseng et al. | .................. 361/704 |
| 6,276,599 B1 | 8/2001 | Ogawa | |
| 6,329,631 B1 | 12/2001 | Yueh | |
| 6,406,934 B1 | 6/2002 | Glenn et al. | |
| 6,448,506 B1 | 9/2002 | Glenn et al. | |
| 6,457,633 B1 | 10/2002 | Takashima et al. | |
| 6,577,013 B1 | 6/2003 | Glenn et al. | |
| 6,670,269 B2 | 12/2003 | Mashino | |
| 6,699,787 B2 | 3/2004 | Mashino | |
| 6,740,950 B2 | 5/2004 | Paek | |
| 6,812,549 B2 | 11/2004 | Umetsu et al. | |
| 6,815,348 B2 | 11/2004 | Mashino | |
| 6,962,829 B2 | 11/2005 | Glenn et al. | |

(Continued)

FOREIGN PATENT DOCUMENTS

| | | |
|---|---|---|
| JP | 2002246540 A | 8/2002 |
| JP | 2004228135 A | 8/2004 |
| TW | 200612539 A | 4/2006 |

*Primary Examiner* — Jae Lee
(74) *Attorney, Agent, or Firm* — Morgan Law Offices, PLC (57) ABSTRACT

A semiconductor structure includes a plurality of thermal vias and a heat dissipation layer disposed at a periphery of a back surface of a lower chip in a stacked-chip package. This arrangement improves solderability of a subsequently-bonded heat sink. Additionally, the thermal vias and the heat dissipation layer provide an improved thermal conduction path for enhancing heat dissipation efficiency of the semiconductor structure. A method for manufacturing the semiconductor structure is also provided.

15 Claims, 7 Drawing Sheets

(56) References Cited

U.S. PATENT DOCUMENTS

| | | |
|---|---|---|
| 7,078,269 B2 | 7/2006 | Yamasaki et al. |
| 7,134,198 B2 | 11/2006 | Nakatani |
| 7,157,372 B1 | 1/2007 | Trezza |
| 7,215,032 B2 | 5/2007 | Trezza |
| 7,222,420 B2 | 5/2007 | Moriizumi |
| 7,238,590 B2 | 7/2007 | Yang et al. |
| 7,262,475 B2 | 8/2007 | Kwon et al. |
| 7,276,787 B2 | 10/2007 | Edelstein et al. |
| 7,285,434 B2 | 10/2007 | Yee et al. |
| 7,298,030 B2 | 11/2007 | McWilliams et al. |
| 7,334,326 B1 | 2/2008 | Huemoeller et al. |
| 7,365,436 B2 | 4/2008 | Yamano |
| 7,371,602 B2 | 5/2008 | Yee |
| 7,388,293 B2 | 6/2008 | Fukase et al. |
| 7,415,762 B2 | 8/2008 | Fukase et al. |
| 7,482,272 B2 | 1/2009 | Trezza |
| 7,508,057 B2 | 3/2009 | Shiraishi et al. |
| 7,508,079 B2 | 3/2009 | Higashi |
| 7,528,053 B2 | 5/2009 | Huang et al. |
| 7,538,033 B2 | 5/2009 | Trezza |
| 7,553,752 B2 | 6/2009 | Kuan et al. |
| 7,560,744 B2 | 7/2009 | Hsiao et al. |
| 7,598,163 B2 | 10/2009 | Callahan et al. |
| 7,605,463 B2 | 10/2009 | Sunohara |
| 7,625,818 B2 | 12/2009 | Wang |
| 7,642,132 B2 | 1/2010 | Huang et al. |
| 7,656,023 B2 | 2/2010 | Sunohara et al. |
| 7,659,202 B2 | 2/2010 | Trezza |
| 7,666,711 B2 | 2/2010 | Pagaila et al. |
| 7,678,685 B2 | 3/2010 | Sunohara et al. |
| 7,681,779 B2 | 3/2010 | Yang |
| 7,687,397 B2 | 3/2010 | Trezza |
| 7,691,747 B2 | 4/2010 | Lin et al. |
| 7,733,661 B2 | 6/2010 | Kossives et al. |
| 7,741,148 B1 | 6/2010 | Marimuthu et al. |
| 7,741,152 B2 | 6/2010 | Huang et al. |
| 7,741,156 B2 | 6/2010 | Pagaila et al. |
| 7,772,081 B2 | 8/2010 | Lin et al. |
| 7,772,118 B2 | 8/2010 | Yamano |
| 7,786,008 B2 | 8/2010 | Do et al. |
| 7,786,592 B2 | 8/2010 | Trezza |
| 7,795,140 B2 | 9/2010 | Taguchi et al. |
| 7,808,060 B2 | 10/2010 | Hsiao |
| 7,808,111 B2 | 10/2010 | Trezza |
| 7,811,858 B2 | 10/2010 | Wang et al. |
| 7,816,265 B2 | 10/2010 | Wang |
| 7,842,597 B2 | 11/2010 | Tsai |
| 2002/0017855 A1 | 2/2002 | Cooper et al. |
| 2002/0094605 A1 | 7/2002 | Pai et al. |
| 2004/0124518 A1 | 7/2004 | Karnezos |
| 2004/0259292 A1 | 12/2004 | Beyne et al. |
| 2005/0189635 A1 | 9/2005 | Humpston et al. |
| 2005/0258545 A1 | 11/2005 | Kwon |
| 2006/0027632 A1 | 2/2006 | Akram |
| 2006/0197216 A1 | 9/2006 | Yee |
| 2007/0048896 A1 | 3/2007 | Andry et al. |
| 2007/0138562 A1 | 6/2007 | Trezza |
| 2007/0187711 A1 | 8/2007 | Hsiao et al. |
| 2008/0272486 A1 | 11/2008 | Wang et al. |
| 2009/0032928 A1 | 2/2009 | Chiang et al. |
| 2009/0039527 A1 | 2/2009 | Chan et al. |
| 2009/0140436 A1 | 6/2009 | Wang |
| 2009/0146297 A1 | 6/2009 | Badakere et al. |
| 2009/0166785 A1 | 7/2009 | Camacho et al. |
| 2009/0243045 A1 | 10/2009 | Pagaila et al. |
| 2009/0294959 A1 | 12/2009 | Chiang et al. |
| 2009/0302435 A1 | 12/2009 | Pagaila et al. |
| 2009/0302437 A1 | 12/2009 | Kim et al. |
| 2009/0309235 A1 | 12/2009 | Suthiwongsunthorn et al. |
| 2009/0321916 A1 | 12/2009 | Wang et al. |
| 2010/0059855 A1 | 3/2010 | Lin et al. |
| 2010/0065948 A1 | 3/2010 | Bae et al. |
| 2010/0133704 A1 | 6/2010 | Marimuthu et al. |
| 2010/0140737 A1 | 6/2010 | Lin et al. |
| 2010/0140751 A1 | 6/2010 | Tay et al. |
| 2010/0140752 A1 | 6/2010 | Marimuthu et al. |
| 2010/0140776 A1 | 6/2010 | Trezza |
| 2010/0148316 A1 | 6/2010 | Kim et al. |
| 2010/0187681 A1 | 7/2010 | Chen et al. |
| 2010/0197134 A1 | 8/2010 | Trezza |
| 2010/0230759 A1 | 9/2010 | Yang et al. |
| 2010/0230760 A1 | 9/2010 | Hung |
| 2010/0230788 A1 | 9/2010 | Peng |
| 2010/0244244 A1 | 9/2010 | Yang |
| 2010/0276690 A1 | 11/2010 | Chen |
| 2010/0283122 A1* | 11/2010 | Pulugurtha et al. ........... 257/532 |
| 2010/0327465 A1 | 12/2010 | Shen et al. |
| 2011/0048788 A1 | 3/2011 | Wang et al. |
| 2011/0068437 A1 | 3/2011 | Chiu et al. |

* cited by examiner

SEMICONDUCTOR STRUCTURE HAVING CONDUCTIVE VIAS AND METHOD FOR MANUFACTURING THE SAME

CROSS-REFERENCE TO RELATED APPLICATIONS

This application claims the benefit of Taiwan application Serial No. 99129126, filed Aug. 30, 2010, the subject matter of which is incorporated herein by reference.

BACKGROUND OF THE INVENTION

1. Field of the Invention

The present invention relates to the field of semiconductor packaging, and, more particularly, to thermal management of stacked-chip packages.

2. Description of Related Art

In stacked-chip packaging, multiple integrated circuit chips can be packaged in a single package structure in a vertically stacked manner. This increases stack density, making the package structure smaller, and often reduces the length of the path that signals must traverse between chips. Thus, stacked-chip packaging tends to increase the speed of signal transmission between or among chips. Additionally, stacked-chip packaging allows chips having different functions to be integrated in a single package structure. Use of through silicon vias (TSV) has been a key technology in realizing stacked-chip packaging integration due to the ability to provide short vertical conductive paths between chips.

However, thermal management of 3-D designs has been challenging. To maintain normal operation of the chip, the chip must be maintained within a limited operation temperature range. Operating temperatures in excess of the limited operation temperature range results in chip performance drop, reduced reliability or damage. Existing stacked-chip packages usually include a heat sink, which is bonded to a lower chip using adhesives and that covers the upper chips of the package.

In current chip processing the surface of the chip is covered with a protective layer, which has a low thermal conductivity and therefore hinders conducting of the heat from the chip interior, where it is produced, to the surrounding environment. Even if the heat sink is disposed on the lower chip of the stacked-chip package structure, the protective layer likewise hinders thermal conductance between the lower chip and the heat sink, thus affecting operation and reliability of the stacked-chip package structure.

SUMMARY OF THE INVENTION

One aspect of the disclosure relates to a semiconductor structure that includes a first chip; a redistribution layer disposed on a first surface of the first chip, the redistribution layer including at least one thermal via contacting the first surface of the first chip; a second chip coupled to the first surface of the first chip; and a heat sink thermally coupled to the at least one thermal via and the second chip.

Another aspect of the disclosure relates to a semiconductor structure that includes a first chip having an active surface and a back surface opposite to the active surface, the first chip having a plurality of through silicon vias; a first wiring layer disposed on the active surface of the first chip, the first wiring layer comprising a first interconnect, the first interconnect connected to one end of each of the through silicon vias; a second wiring layer disposed on the back surface of the first chip, the second wiring layer comprising a second interconnect and at least one thermal via, the second interconnect connected to the other end of each of the through silicon vias, the at least one thermal via electrically insulated from the second interconnect and contacting the back surface of the first chip; a plurality of bump pads disposed on the second wiring layer, each of the bump pads connected to the second interconnect; and a heat dissipation layer disposed on the second wiring layer in an area where the bump pads are not located, the heat dissipation layer connected to the thermal via.

Another aspect of the disclosure relates to manufacturing methods. In one embodiment, a manufacturing method includes providing a semiconductor wafer, the semiconductor wafer having an active surface, the semiconductor wafer having a plurality through silicon vias, a first wiring layer formed on the active surface of the semiconductor structure, the first wiring layer comprising a first interconnect, the first interconnect connected to one end of each of the through silicon vias; thinning the semiconductor wafer from a back surface of the semiconductor wafer opposite to the active surface to expose the other end of each of the through silicon vias and a back surface of the semiconductor wafer; forming a second wiring layer on the back surface of the semiconductor wafer, the second wiring layer comprising a second interconnect and a thermal via, the second interconnect connected to the other end of each of the through silicon vias, the thermal via electrically insulated from the second interconnects and contacting the back surface of the semiconductor structure; and forming a plurality of bump pads and a heat dissipation layer, each of the bump pads connected to the second interconnect, the heat dissipation layer connected to the thermal via.

BRIEF DESCRIPTION OF THE DRAWINGS

FIGS. 2H' and 2I' illustrate substitute steps of the process as shown in FIGS. 2A-2K according to one embodiment of present invention.

Common reference numerals are used throughout the drawings and the detailed description to indicate the same elements. The present invention will be more apparent from the following detailed description taken in conjunction with the accompanying drawings.

DESCRIPTION OF THE EMBODIMENTS

Figure 1:
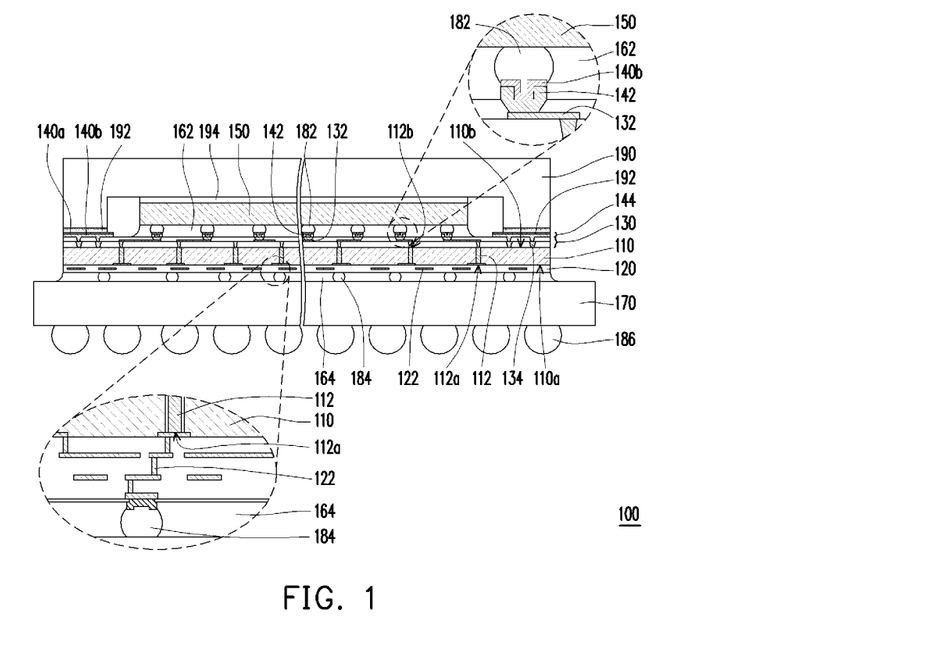
FIG. 1 illustrates a semiconductor structure according to one embodiment of the present invention.

Referring to FIG. 1, there is shown a semiconductor structure 100 according to one embodiment of the present invention. The semiconductor structure 100 includes a first chip 110 having a plurality of through silicon vias (TSV) 112 in the semiconductor substrate thereof. It is to be appreciated that although silicon is the preferred semiconductor substrate material, the invention applies to any semiconductor material used in semiconductor chip fabrication, such as germanium, silicon germanium, gallium arsenide, or other III-V and II-IV compounds and the term is used generically throughout the disclosure regardless of the semiconductor material.

TSV fabrication can be placed into two main categories: "Via-First" processing and "Via-Last" processing. Via-First processing means that the through silicon vias are formed early in the manufacturing process, before the "back-end-ofline" (BEOL) processing. For Via-Last processing, the through silicon vias are fabricated after the BEOL processing.

For Via-First, since the through silicon vias are buried inside the substrate material before the BEOL processing, the wafer requires an additional thinning process to expose the vias on the wafer back surface and an additional passivation step to isolate the substrate material from an electrical redistribution layer on the back surface.

A first wiring layer 120 or redistribution layer, commonly referred to as "RDL" is disposed on an active surface 110a of the first chip 110. The various wiring layers or RDL disclosed below are typically include one or more layers of dielectric or passivation material and one or more layers of conductive material for routing, and under bump metallurgy. The first wiring layer 120 includes a first interconnect 122. The first interconnect 122 may, for example, be an interconnect formed during the back end of line of the wafer process. The first interconnect 122 is, for example, connected between end 112a of each of the through silicon vias 112 and a second bump 184 disposed at a bottom side of the first chip 110. In addition, other active or passive elements (not shown) may exist in the first chip 110 and, therefore, the first interconnect 122 may be also connected with these active or passive elements.

A second wiring layer 130 or RDL is disposed at a back side 110b of the first chip 110. The second wiring layer 130 includes a second interconnect 132 and a plurality of thermal vias 134. The second interconnect 132 is connected to the other end 112b of each of the through silicon vias 112. As shown, the thermal vias 134 are electrically insulated from the second interconnect 132 and contacts the back side 110b of the first chip 110. Here, the thermal vias 134 are mainly used for thermal conduction.

A plurality of bump pads 142 is disposed on the second wiring layer 130. Each bump pad 142 is connected to the second interconnect 132. In addition, a heat dissipation layer 144 is disposed on the second wiring layer 130 in the area where the bump pads 142 are not located. The heat dissipation layer 144 is connected to the thermal vias 134.

A second chip 150 is disposed above the first chip 110 and is connected with the bump pads 142 via a plurality of first bumps 182, such that the second chip 150 is electrically connected to the through silicon vias 112 of the first chip 110 via the first bumps 182, the bump pads 142 and the second interconnect 132. In order to protect the first bumps 182, a first underfill 162 is filled between the second chip 150 and the second wiring layer 130 to enclose the first bumps 182. The second chip 150 may also have an RDL formed on the active surface to facilitate patterning of the bumps.

As shown in FIG. 1, the foregoing structure may be disposed on a carrier substrate 170. The carrier substrate 170 may, for example, be a common printed circuit board, a ceramic substrate, a metal substrate, or another suitable type of carrier substrate for supporting the first chip 110. A plurality of second bumps 184 is disposed between the first wiring layer 120 and the carrier substrate 170 to electrically connect the first wiring layer 120 to the carrier substrate 170. In order to protect the second bumps 184, a second underfill 164 may be filled between the first wiring layer 120 and the carrier substrate 170 to enclose the second bumps 184. In addition, a plurality of solder balls 186 may be disposed on a bottom of the carrier substrate 170 as a path along which the entire semiconductor structure 100 is connected to an external circuit.

A heat sink 190 may be disposed on the first chip 110 to enhance heat dissipation efficiency. The heat sink 190 covers the second chip 150 and is coupled to the heat dissipation layer 144 on the first chip 110, such that heat generated by the first chip 110 and second chip 150 during operation can be dissipated to the surrounding environment by the heat sink 190. In order to position the heat sink 190 and enhance the efficiency of thermal conduction between the heat sink 190 and the first chip 110/second chip 150, a first thermally conductive adhesive 192 may be disposed between the heat sink 190 and the heat dissipation layer 144, and a second thermally conductive adhesive 194 may be disposed between the heat sink 190 and the second chip 150.

In the present embodiment, the second wiring layer 130 is provided with the thermal vias 134, such that a large part of the heat generated by the first chip 110 can be transferred to a thermal conductive path comprising the thermal vias 134, the heat dissipation layer 144, and the heat sink 190, without being hindered by the dielectric material, having a lower thermal conductance, in the second wiring layer 130. As a result of adding the thermal conductive path, the semiconductor structure 100 of the present embodiment has improved heat dissipation efficiency and operation reliability in comparison with existing structures.

In addition, in the present embodiment, the heat dissipation layer 144 and the bump pads 142 may be fabricated using the same or similar materials. For example, the surface layer of the bump pad 142 can be a nickel-gold stack layer 140b, which has good wettability. Likewise, the heat dissipation layer 144 also can have this nickel-gold stack layer 140b as its surface layer, thus improving the solderability between the heat sink 190 and the heat dissipation layer 144.

Furthermore, in the present embodiment, a thermal path which includes the heat sink 190, the heat dissipation layer 144 and the thermal vias 134 can also form a ground path through additional TSV's in the first chip 110 (not shown) so as to electrically interconnect with the substrate 170 and a ground plane external to the structure 100 thereby forming an electromagnetic interference shield and preventing external electromagnetic fields from interfering with electrical performance of the first chip 110 and the second chip 150.

Figure 2A:
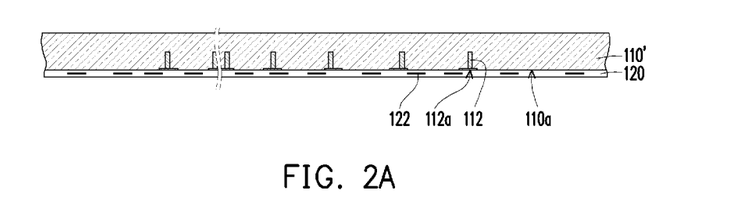
FIGS. 2A-2K illustrate a method for manufacturing a semiconductor structure according to one embodiment of present invention.

Referring to FIG. 2A, a semiconductor wafer 110' is first provided. The semiconductor wafer 110' is used to form the first chip 110 of FIG. 1 after a subsequent dicing process. The semiconductor wafer 110' includes an active surface 110a, and the plurality of through silicon vias 112 formed in an interior thereof. In addition, the active surface 110a of the semiconductor wafer 110' includes the first wiring layer 120. The first wiring layer 120 includes a first interconnect (e.g., back-end-of-line interconnect) 122, and the first interconnect 122 is connected to one end of each of the through silicon vias 112.

Figure 2B:
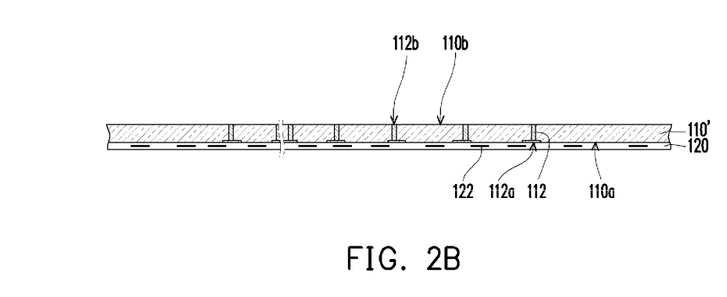

As shown in FIG. 2B, the semiconductor wafer 110' is thinned from a back side of the semiconductor wafer 110' opposite to the active surface 110a so as to expose the other end 112b of each of the through silicon vias 112 and the back surface 110b of the semiconductor wafer 110'.

Figure 2C:
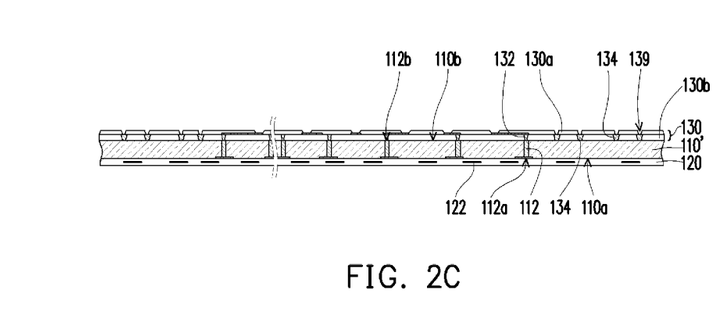

As shown in FIG. 2C, a second wiring layer 130 is then formed on the back surface 110b of the semiconductor wafer 110'. The second wiring layer 130 includes therein a second interconnect 132 and the thermal vias 134. The second interconnect 132 is connected to the other end 112b of each of the through silicon vias 112. The thermal vias 134 are electrically insulated from the second interconnect 132 and contact the back surface 110b of the semiconductor wafer 110'. Here, the second wiring layer 130 may be a stack of a single or multiple metal layers 130a and a dielectric layer 130b. The uppermost dielectric layer 130b has a plurality of openings 139 to expose the second interconnect 132 and the thermal vias 134.

Figure 2D:
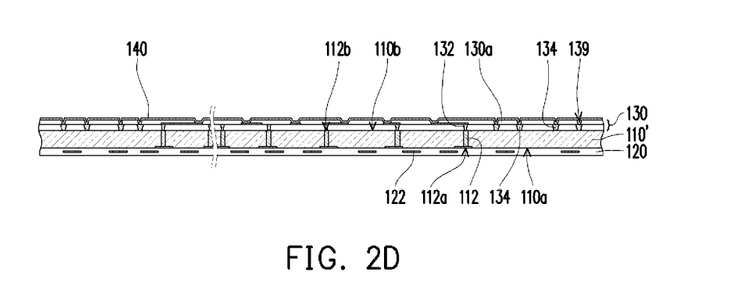
Figure 2E:
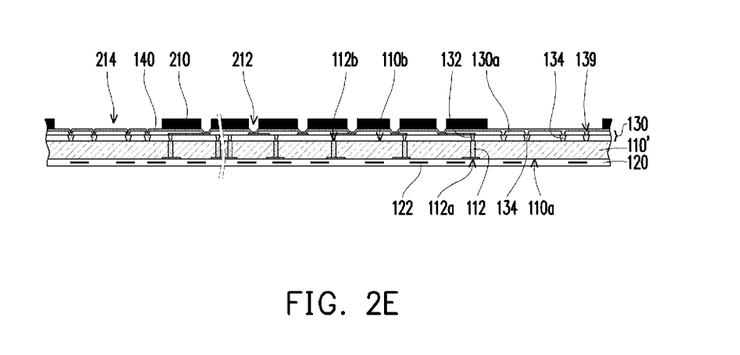

As shown in FIG. 2D, a plating seed layer 140 is then formed over the entire area of the second wiring layer 130. The plating seed layer 140 is electrically connected to the second interconnect 132 and the thermal vias 134 through the openings 139. As shown in FIG. 2E, a mask 210 is then formed over the plating seed layer 140 to define a plurality of pad regions 212 and a heat dissipation region 214 on the plating seed layer 140. The pad regions 212 are positioned in correspondence with the second interconnect 132, and the heat dissipation region 214 is positioned in correspondence with the thermal vias 134.

Figure 2F:
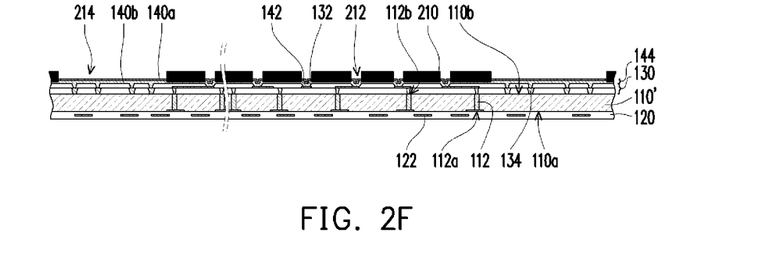

In FIG. 2F, a plating process is performed on the plating seed layer 140 to form a plurality of bump pads 142 within the pad regions 212 and, at the same time, form a heat dissipation layer 144 within the heat dissipation region 214. Each bump pad 142 is connected to the second interconnect 132, and the heat dissipation layer 144 is connected to the thermal vias 134. In the plating process, in order to increase the solderability between the bump pads 142 and the subsequently bonded second bumps 184 and the solderability between the heat dissipation layer 144 and the subsequently bonded heat sink 190, a copper layer 140 and the nickel-gold stack layer 140b may be formed by plating. A gold layer is used as the surface layer of the plated structure, which has good wettability, thus increasing the yield of the subsequent soldering process.

Figure 2G:
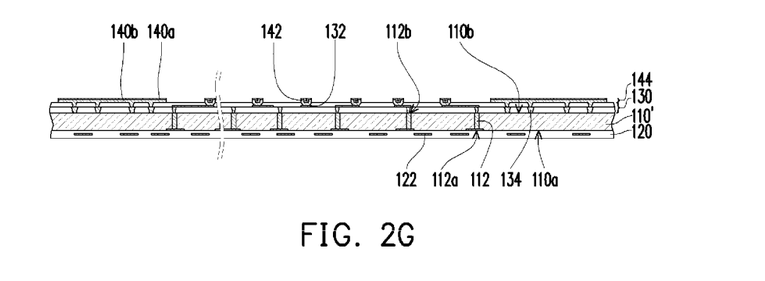

As shown in FIG. 2G, the mask 210 and the portion of the plating seed layer 140 covered by the mask 210 are then removed. The structure shown in FIG. 2G is a semi-finished product of the semiconductor structure 100, which may be shipped in the form of wafers or individual chips after a sawing process.

The following description explains a subsequent process of stacking chips on the semi-product in the form of a wafer after the step of FIG. 2G.

Figure 2H:
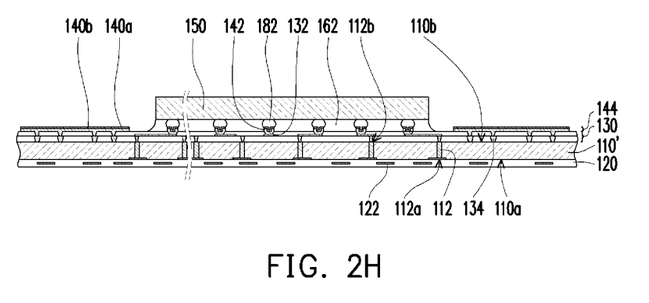

As shown in FIG. 2H, multiple second chips 150 (only one shown in FIG. 2H) are flip-chip bonded to the semiconductor wafer 110'. Each of the second chip 150 is connected to a corresponding one of the bump pads 142 through a corresponding first bump 182. Additionally, in the present embodiment, the first underfill 162 is optionally applied between the second chips 150 and the second wiring layer 130, with the first underfill 162 enclosing the first bumps 182. The step of filling underfill 162 may be performed before or after the second chips 150 are flip-chip bonded to the semiconductor wafer 110'. That is, the first underfill 162 may be formed on the second wiring layer 130 before each of the second chips 150 is bonded to the semiconductor wafer 110', or may be filled between the second chips 150 and the second wiring layer 130, after each of the second chips 150 is bonded to the semiconductor wafer 110'.

Figure 2I:
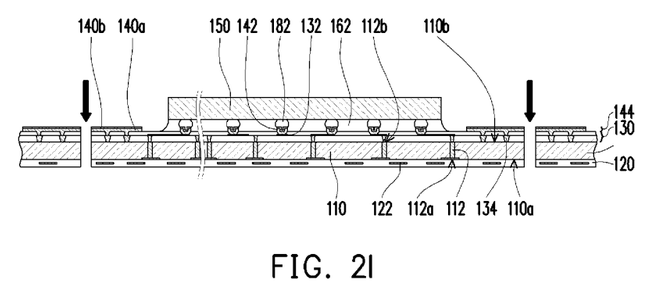

As shown in FIG. 2I, after the second chips 150 are flip-chip bonded to the semiconductor wafer 110', the semiconductor wafer 110' is sawed into a plurality of individual first chips 110.

Figure 2J:
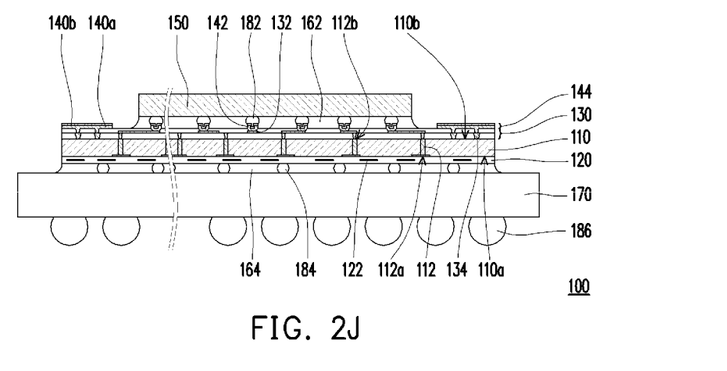

As shown in FIG. 2J, the first chip 110 is flip-chip bonded to the carrier substrate 170. The through silicon vias 112 of the first chip 110 are electrically connected to the carrier substrate 170 via the second bumps 184. Additionally, in the present embodiment, the second underfill 164 may also be filled between the first chip 110 and the carrier substrate 170 to enclose the second bumps 184. The second underfill 164 may be pre-formed on the carrier substrate 170 before the first chip 110 is bonded to the carrier substrate 170, or filled between the first chip 110 and the carrier substrate 170 after the first chip 110 is bonded to the carrier substrate 170.

FIG. 2H' and 2I' depicts a subsequent process of sawing the semi-finished product in the form of individual chips, and then stacking the individual chip on a carrier substrate.

As shown in FIG. 2H', the semiconductor wafer 110' is sawed into a plurality of the individual first chips 110. As shown in FIG. 2I', after the semiconductor wafer 110' is sawed, one of the individual first chips 110 is flip-chip bonded to the carrier substrate 170. Then, as shown in 2J, the second chip 150 is flip-chip bonded to the individual first chip 110.

Figure 2K:
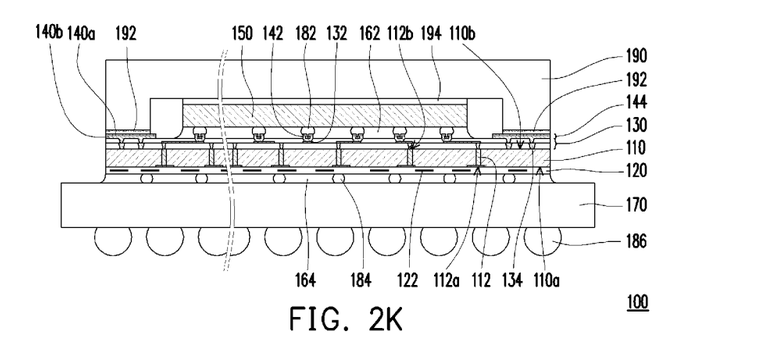

In addition, as shown in FIG. 2K, the heat sink 190 may be disposed on the first chip 110, substantially completing the fabrication of the semiconductor structure 100. The heat sink 190 covers the second chip 150 and is thermally coupled to the heat dissipation layer 144.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor structure comprising:
    a first chip;
    a redistribution layer disposed on a first surface of the first chip, the redistribution layer including at least one thermal via contacting the first surface of the first chip;
    a second chip coupled to the first surface of the first chip;
    a heat sink and thermally coupled to the at least one thermal via and the second chip;
    a heat dissipation layer disposed between the at least one thermal via and the heat sink; and
    a thermal conductive adhesive between the heat sink and the heat dissipation layer.

2. The semiconductor structure of claim 1, wherein the at least one thermal via is electrically isolated from the second chip.

3. The semiconductor structure of claim 1, wherein the heat dissipation layer comprises at least one plating layer.

4. The semiconductor structure of claim 1, wherein the at least one thermal via is formed on the inactive surface of the first chip.

5. The semiconductor structure of claim 1, wherein a portion of the heat generated by the first chip is channelled by the at least one thermal via to the heat sink.

6. The semiconductor structure of claim 1, wherein the heat sink is coupled to an inactive surface of the second chip by a thermal conductive adhesive.

7. The semiconductor structure of claim 6, wherein heat generated by the first chip is channelled by the at least one thermal via to the heat sink and heat generated by the second chip is channelled by the thermal conductive adhesive to the heat sink.

8. The semiconductor structure of claim 1, wherein the heat sink is attached to the heat dissipation layer.

9. A semiconductor structure comprising:
- a first chip having an active surface and a back surface opposite to the active surface, the first chip having a plurality of through silicon vias;
- a first wiring layer disposed on the active surface of the first chip, the first wiring layer comprising a first interconnect, the first interconnect connected to one end of each of the through silicon vias;
- a second wiring layer disposed on the back surface of the first chip, the second wiring layer comprising a second interconnect and at least one thermal via, the second interconnect connected to the other end of each of the through silicon vias, the at least one thermal via electrically insulated from the second interconnect and contacting the back surface of the first chip;
- a plurality of bump pads disposed on the second wiring layer, each of the bump pads connected to the second interconnect;
- a heat dissipation layer disposed on the second wiring layer in an area where the bump pads are not located, the heat dissipation layer connected to the at least one thermal via;
- a heat sink coupled to the heat dissipation layer;
- a second chip electrically coupled to the first chip and attached to the heat sink; and
- a thermally conductive adhesive disposed between the heat sink and the second chip.

10. The semiconductor structure of claim 9, wherein heat generated by the first chip is transferred to a thermal conductive path, the thermal conductive path including the at least one thermal via, the heat dissipation layer, and the heat sink.

11. The semiconductor structure of claim 9, wherein heat generated by the first chip is channelled by the at least one thermal via to the heat sink and heat generated by the second chip is channelled by the thermal conductive adhesive to the heat sink.

12. The semiconductor structure of claim 9, wherein the heat dissipation layer and the bump pads are fabricated using the same materials.

13. The semiconductor structure of claim 9, wherein the bump pads and the heat dissipation layer each include a nickel-gold surface layer.

14. The semiconductor structure of claim 13, wherein the bump pads and the heat dissipation layers each include a copper layer having the nickel-gold surface layer deposited thereon, the copper layer of the bump pads contacting the second interconnect.

15. The semiconductor structure of claim 9, wherein the at least one thermal via and the heat dissipation layer are electrically isolated from the second chip.

* * * * *